(12) United States Patent
Hnayno et al.

(10) Patent No.: US 12,513,864 B2
(45) Date of Patent: Dec. 30, 2025

(54) HYBRID LIQUID COOLING ARRANGEMENT FOR AUTONOMOUS AND IMMERSION COOLED RACKS

(71) Applicant: OVH, Roubaix (FR)

(72) Inventors: Mohamad Hnayno, Roubaix (FR); Ali Chehade, Moncheaux (FR); Tristan Vuillier, Roubaix (FR)

(73) Assignee: OVH, Roubaix (FR)

( * ) Notice: Subject to any disclaimer, the term of this patent is extended or adjusted under 35 U.S.C. 154(b) by 219 days.

(21) Appl. No.: 18/236,498

(22) Filed: Aug. 22, 2023

(65) Prior Publication Data

US 2024/0074118 A1 Feb. 29, 2024

(30) Foreign Application Priority Data

Aug. 26, 2022 (EP) ..................................... 22306268

(51) Int. Cl.
*H05K 7/20* (2006.01)
(52) U.S. Cl.
CPC ..... *H05K 7/20772* (2013.01); *H05K 7/20236* (2013.01); *H05K 7/20263* (2013.01); *H05K 7/20836* (2013.01)
(58) Field of Classification Search
CPC ........... H05K 7/20236; H05K 7/20763–20781
See application file for complete search history.

(56) References Cited

U.S. PATENT DOCUMENTS

| | | | |
|---|---|---|---|
| 10,064,313 B2 * | 8/2018 | Ishinabe | H05K 7/20781 |
| 2014/0060798 A1 | 3/2014 | Eckberg et al. | |
| 2014/0202678 A1 | 7/2014 | Goth et al. | |
| 2018/0338388 A1 | 11/2018 | Wei et al. | |
| 2022/0201896 A1 | 6/2022 | Edmunds et al. | |
| 2022/0225545 A1 | 7/2022 | Heydari | |
| 2022/0322575 A1 * | 10/2022 | Hnayno | H05K 7/20772 |

OTHER PUBLICATIONS

European Search Report with regard to the EP Patent Application No. 22306268.8 completed Feb. 6, 2023.

* cited by examiner

*Primary Examiner* — Zachary Pape
(74) *Attorney, Agent, or Firm* — BCF LLP

(57) ABSTRACT

A datacenter rack assembly providing a liquid cooling arrangement to service an autonomous rack and an immersion cooling rack coexisting within the datacenter rack assembly is presented. The datacenter rack assembly comprises an autonomous rack containing at least one electronic processing assembly, an integrated heat exchanger, and at least one liquid cooling block while the immersion cooling rack comprises a dielectric immersion cooling fluid at least one electronic processing assembly immersed in the dielectric immersion cooling fluid, and at least one liquid cooling block. The datacenter rack assembly incorporates a liquid cooling distribution arrangement to control distribution of liquid for cooling of the autonomous and IC racks through various liquid flow distribution channel segments, temperature sensors, and communication-enabled flow control valves based on detected temperature conditions.

12 Claims, 4 Drawing Sheets

HYBRID LIQUID COOLING ARRANGEMENT FOR AUTONOMOUS AND IMMERSION COOLED RACKS

CROSS REFERENCE

The present application claims priority to EP Application No. 22306268.8, filed Aug. 26, 2022 entitled "Hybrid Liquid Cooling Arrangement for Autonomous and Immersion Cooled Racks", the entirety of which is incorporated herein by reference.

FIELD OF TECHNOLOGY

The present technology generally relates to cooling techniques of electronic equipment rack assemblies within datacenters. In particular, a hybrid cooling arrangement to service forced air, liquid block cooling of rack assemblies and immersion cooling rack assemblies is presented.

BACKGROUND

Datacenters and other large computing facilities may house thousands or even tens of thousands of rack-mounted electronic computing equipment (e.g., servers, processors, etc.). During operations, the electronic processing assemblies of the rack-mounted equipment, which may contain intensive processing units, such as, central processing units (CPUs), graphics processing units (GPUs), neural processing units (NPUs), tensor processing units (TPUs), etc., generate substantial amounts of heat that must be quelled or at least dissipated in order to avoid individual electronic component failures and ensure reliable and consistent operations.

Various measures have been implemented to address the heat generated by the one or more electronic processing assemblies. One such measure provides for a self-contained, autonomous rack configuration 100 that implements the combination of forced-air ventilation cooling techniques as well as direct liquid block cooling techniques for cooling one or more heat-generating electronic processing assemblies 140. In a representative embodiment, as illustrated by FIG. 1, an autonomous rack configuration 100 includes a rack frame 110 for housing one or more heat-generating electronic processing assemblies 140 (e.g. servers).

The autonomous rack configuration 100 includes a first cooling loop 102 and a second cooling loop 104. A liquid-to-liquid heat exchanger 175, for example a plate heat exchanger (PHEX) is implemented to thermally connect the first and second cooling loops 102, 104. The first and second cooling loops 102, 104 include a first and a second pumps 135, 195 respectively for circulating fluids therein.

Within the first cooling loop 102, a first heat transfer liquid (e.g. a dielectric liquid), is conveyed from a first side 177 of the liquid-to-liquid heat exchanger 175 to a plurality of liquid cooling blocks 152 arranged in a direct cooling liquid block arrangement 150, the liquid cooling blocks 152 being arranged to be in direct thermal contact with the one or more heat-generating electronic processing assemblies 140 to maximize cooling efficiency. The liquid cooling blocks 152 may be, for example, fluidly connected in series or in parallel with one another. The liquid cooling blocks 152 are equipped with internal fluid distribution channels (not shown) to facilitate the flow of first heat transfer liquid therethrough. The first heat transfer liquid collects thermal energy from the heat-generating electronic processing assemblies 140 upon flowing within the liquid cooling blocks 152 and is further redirected to the first side 177 of the liquid-to-liquid heat exchanger 175.

The thermal energy collected by the first heat transfer liquid is transferred to the second cooling loop 104 within the liquid-to-liquid heat exchanger 175.

Within the second cooling loop 104, a second cooling fluid is provided to a second side 179 of the liquid-to-liquid heat exchanger 175 such that, in use, the second cooling fluid may collect thermal energy of the first heat transfer liquid. More specifically, the second side 179 is thermally coupled to the first side 177 for transfer of heat from the first side 177 to the second side 179 when a temperature of the first side 177 is higher than a temperature of the second side 179. Hot second cooling fluid is further circulated back to an external heat exchanger 120 (e.g. a dry cooler) to cool the hot second cooling fluid.

Once the second heat transfer liquid has been cooled by the external heat exchanger 120, the second heat transfer liquid is directed to an air-to-liquid heat exchanger 165 that may be implemented within or on the rack frame 110, the air-to-liquid heat exchanger 165 being equipped with a forced air ventilation fan 180. The heat exchanger 165 thus receives cool second heat transfer liquid. The heat exchanger 165 includes internal fluid conduits that function to circulate the cool second heat transfer liquid throughout the heat exchanger 165. More specifically, the heat exchanger 165 transfers, in use, thermal energy of the ambient heated air to the cool second heat transfer liquid circulating in the internal fluid conduits of the heat exchanger 165. Cooled air is thus expelled from the rack frame 110 by the forced air ventilation fan 180. This may thus cool ambient air in a vicinity of the rack frame 110.

Another measure implemented to address the heat generated by the electronic processing assemblies involves an immersive cooling (IC) rack configuration 200. In a representative embodiment, as illustrated by FIG. 2, an IC rack configuration 200 consists of a rack frame 202 that incorporates an immersion case 204 containing a dielectric immersion cooling fluid 206. The one or more electronic processing assemblies 210A-210N are submerged within the dielectric immersion cooling fluid 206 along with a serpentine convection coil 220.

The IC rack configuration 200 also implements a cooling liquid block arrangement 216, configured to supply cool heat transfer liquid (e.g. water) from a fluid inlet 121 to the serpentine convection coil 220. The serpentine convection coil 220 is structured with multiple hollow-channel coils that receive and internally channel the cool heat transfer liquid to reduce the temperature of the ambient dielectric cooling fluid 206 as well as direct the cool cooling liquid to liquid blocks 212A-212N via arrangement 216. As noted above, liquid cooling blocks 212A-212N are arranged to be in direct thermal contact with the one or more electronic processing assemblies 210A-210N and are equipped with internal fluid distribution channels 214A-214N to facilitate the flow of cool cooling liquid therethrough.

As such, the direct cooling liquid block arrangement 216 operates to direct the flow of cool cooling liquid through the serpentine convection coil 220 to reduce the ambient temperature of the dielectric cooling fluid 206, direct the flow of cool cooling liquid through the internal channels 214A-214N of liquid cooling blocks 212A-212N to reduce the temperatures of the corresponding one or more electronic processing assemblies 210A-210N, as well as return the flow of warm cooling liquid heated by the one or more electronic processing assemblies 210A-210N back to a hot liquid outlet 122.

While the noted representative autonomous rack and IC rack configurations have proven to provide significant cooling measures for heat-generating electronic processing assemblies, it should be appreciated that implementing different cooling arrangements to support these different configurations within rack assemblies on a large scale can be cost prohibitive for datacenters.

Consequently, there is an interest in developing a hybrid cooling arrangement that exploits certain features of the different autonomous rack and IC rack configurations to provide cooling measures capable of effectively supporting the cooling needs of both autonomous racks and IC racks that coexist within a datacenter rack assembly.

SUMMARY

The embodiments of the present disclosure are provided based on developers' understanding of the drawbacks associated with conventional dielectric fluid immersive cooling systems for cooling electronic assemblies containing heat-generating components.

In addressing such drawbacks, the embodiments of the present disclosure provide a rack assembly configuration comprising a rack fluidly connected to a heat exchanger and comprising at least one electronic processing assembly, a first internal fluid conduit configured to receive cooling liquid and circulate the cooling liquid throughout a first at least one liquid cooling block, the first at least one liquid cooling block having a first internal fluid distribution channel that is arranged to be in thermal contact with the first at least one electronic processing assembly.

The rack assembly configuration further comprises an immersion cooling (IC) rack containing a dielectric immersion cooling fluid, a second at least one electronic processing assembly immersed in the dielectric immersion cooling fluid, a second internal fluid conduit configured to receive the cooling liquid exiting the first at least one liquid cooling block and further configured to circulate the cooling liquid throughout a second at least one liquid cooling block having a second internal fluid distribution channel that is arranged to be in thermal contact with the second at least one electronic processing assembly.

The rack assembly configuration also comprises a liquid cooling distribution arrangement configured to control distribution of the cooling liquid circulating throughout the rack and the IC rack that comprises a first liquid flow distribution channel segment configured to forward the cooling liquid from a cool liquid source to the rack, a second liquid flow distribution channel segment configured to forward cooling liquid from the rack to the IC rack.

Additional aspects of the rack assembly configuration comprise a first temperature sensor coupled to the first liquid flow distribution channel segment and configured to detect a temperature of the cool liquid source, a second temperature sensor coupled to the second liquid flow distribution channel segment and configured to detect a temperature of the forwarded cooling liquid from the autonomous rack; and a controller configured to cause when the first temperature sensor detects a temperature of the cool liquid source to be less than or equal to a first temperature range, the two-way flow control valve is controlled to close and the three-way flow control valve is controlled to open and forward the cooling liquid from the rack to the IC rack via the third liquid flow distribution channel segment.

Further aspects of the rack assembly configuration provide that the controller is also configured to cause when the second temperature sensor detects a temperature of the cooling liquid outputted from the rack to be less than or equal to a second temperature range, the two-way flow control valve is controlled to close and the three-way flow control valve is controlled to open and forward the cooling liquid from the rack to the IC rack via the third liquid flow distribution channel segment, and when the second temperature sensor detects a temperature of the cooling liquid outputted from the rack to be in a third range that is greater than the second temperature range, the three-way flow control valve is controlled to close and the two-way flow control valve is controlled to open and forward the cooling liquid from the cool liquid source provided by the fourth liquid flow distribution channel segment to the IC rack via the third liquid flow distribution channel segment.

Further aspects of the rack assembly configuration provide that the first temperature range detected by the first temperature sensor comprises approximately 20-25° C., the second temperature range detected by the second temperature sensor comprises approximately 40-46° C., and the third temperature range detected by the second temperature sensor comprises approximately 47° C. or greater.

The embodiments of the present disclosure further provide a liquid cooling method for servicing a rack assembly configuration comprising an autonomous rack and an immersion cooling (IC) rack coexisting within the same rack assembly. The autonomous rack comprises a first internal fluid conduit configured to receive cooling liquid and circulate the cooling liquid throughout a first at least one liquid cooling block and the IC rack comprises a second internal fluid conduit configured to receive the cooling liquid exiting the first at least one liquid cooling block and further configured to circulate the cooling liquid throughout a second at least one liquid cooling block. The rack assembly configuration further comprises a first temperature sensor disposed at an input side of the autonomous rack, a second temperature sensor disposed at an output side of the autonomous rack, a flow controller configured to receive the detected temperatures provided by the first and second temperature sensors, and a liquid flow distribution channel facility between the autonomous rack and the IC rack that incorporates a two-way flow control valve and a three-way flow control valve.

The liquid cooling method comprises detecting the input side temperature of the autonomous rack by the first temperature sensor and detecting the output side temperature of the autonomous rack by the second temperature sensor and communicating the detected input and output side temperatures to the flow controller.

The method further comprises that if the detected input side temperature communicated to the flow controller is within approximately 20-25° C., the flow controller instructs a two-way flow control valve to close while instructing a three-way flow control valve to open to enable the flow of cooling liquid outputted from the autonomous rack to the IC rack. If the detected input side temperature communicated to the flow controller is greater than approximately 20-25° C. and the detected output side temperature communicated is within a range of approximately 40-46° C., then the flow controller instructs a two-way flow control valve to close while instructing a three-way flow control valve to open to enable the flow of cooling liquid outputted from the autonomous rack to the IC rack. And, if the detected output side temperature communicated to the flow controller is greater than the range of approximately 40-46° C., the flow controller instructs the three-way flow control valve to close while instructing the two-way flow control valve to open and forward the flow of cool cooling liquid from a cooling liquid source to the IC rack.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
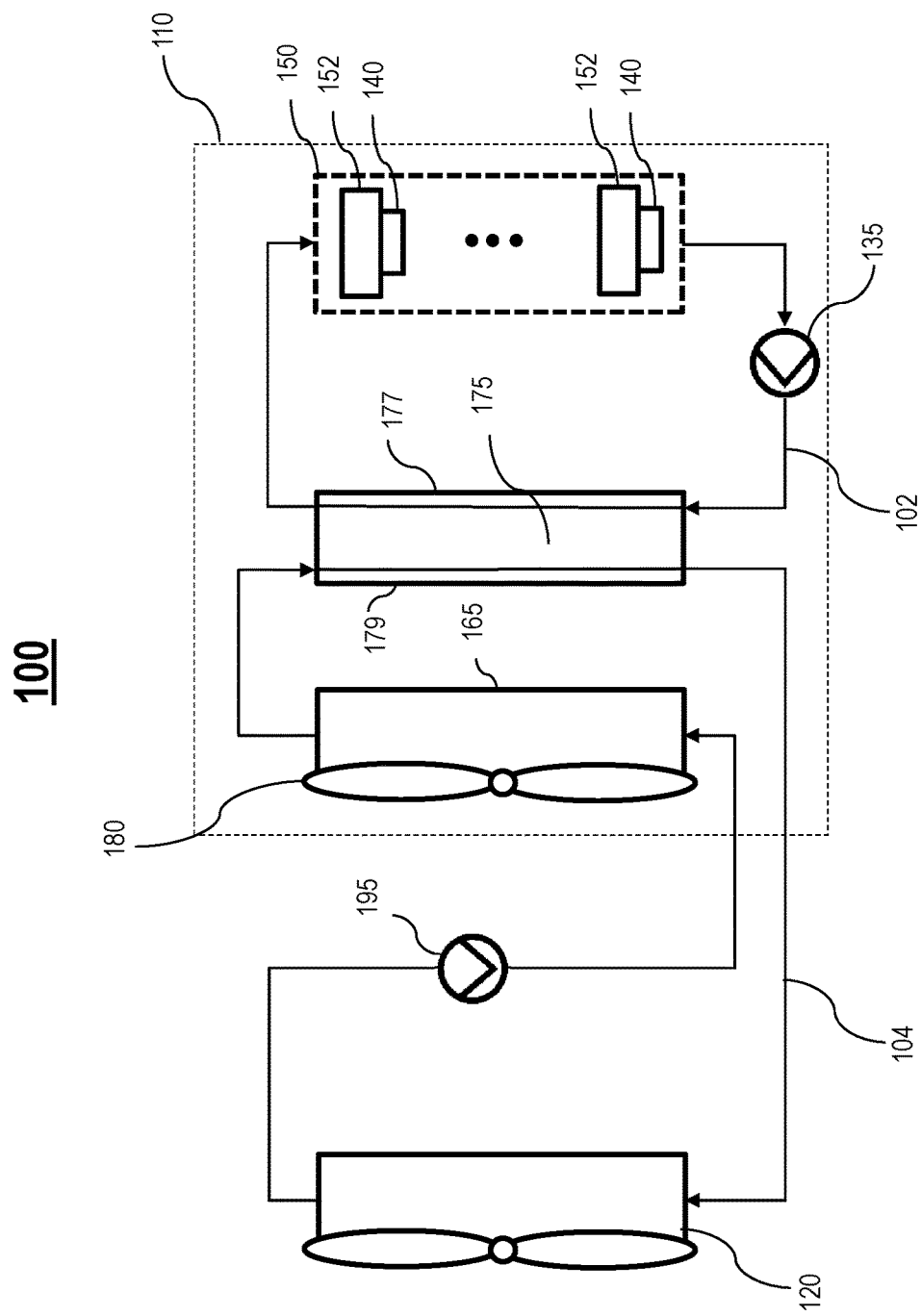
FIG. 1 illustrates a side elevation view of a representative self-contained, autonomous rack configuration, in accordance with the embodiments of the present disclosure.
Figure 2:
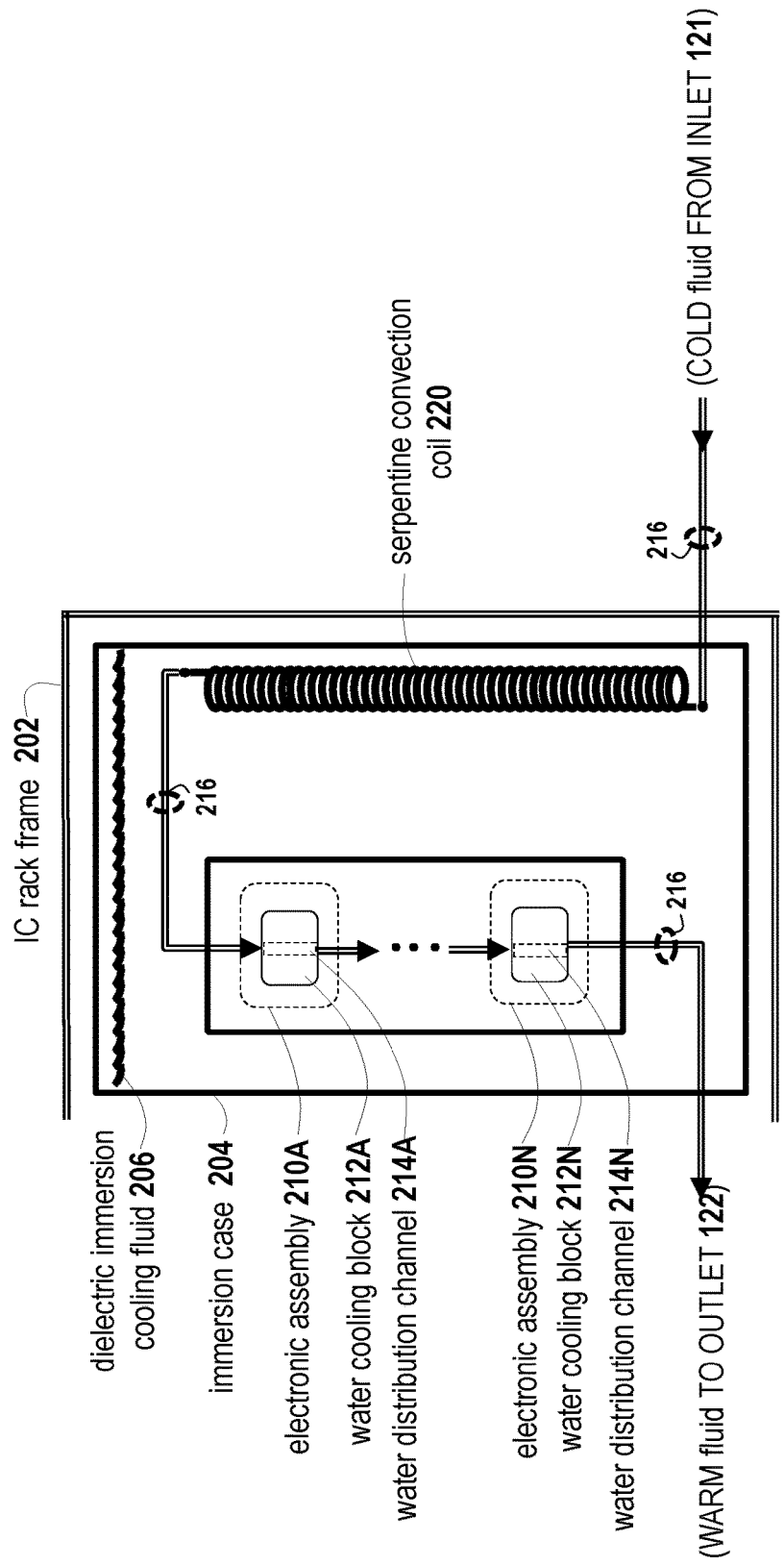
FIG. 2 illustrates a side elevation view of a representative immersion cooling rack configuration, in accordance with the embodiments of the present disclosure.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

Aspects of the inventive concepts provided by the embodiments of the present disclosure are directed to a hybrid cooling arrangement capable of supporting the cooling needs of combined forced air and liquid block cooling configurations with immersive cooling configurations that coexist in datacenter rack assemblies.

With these fundamental principles in place, we will now consider some nonlimiting examples to illustrate various implementations of aspects of the present disclosure.

While autonomous rack 100 and IC rack 200 manifest different configurations, there are certain common features between the two configurations as well as different temperature tolerances that can be exploited to provide a hybrid cooling arrangement capable of efficiently supporting both configurations to coexist within a datacenter rack assembly. For example, both autonomous rack 100 and IC rack 200 configurations employ cool cooling liquid supplied via a cold liquid inlet 121 as well as incorporate direct cooling liquid block arrangements 150/216 that channel cool cooling liquid internally therethrough to reduce the temperatures of the one or more heat generating electronic processing assemblies 140/210A-210N.

Moreover, the developers have empirically observed that the internally channeled cooling liquid of the IC rack 200 configurations are less temperature sensitive due to the use of dielectric immersion cooling fluids 206. As such, IC rack 200 configurations are capable of tolerating, and effectively operating with, higher temperature channeled cooling liquid.

Figure 3:
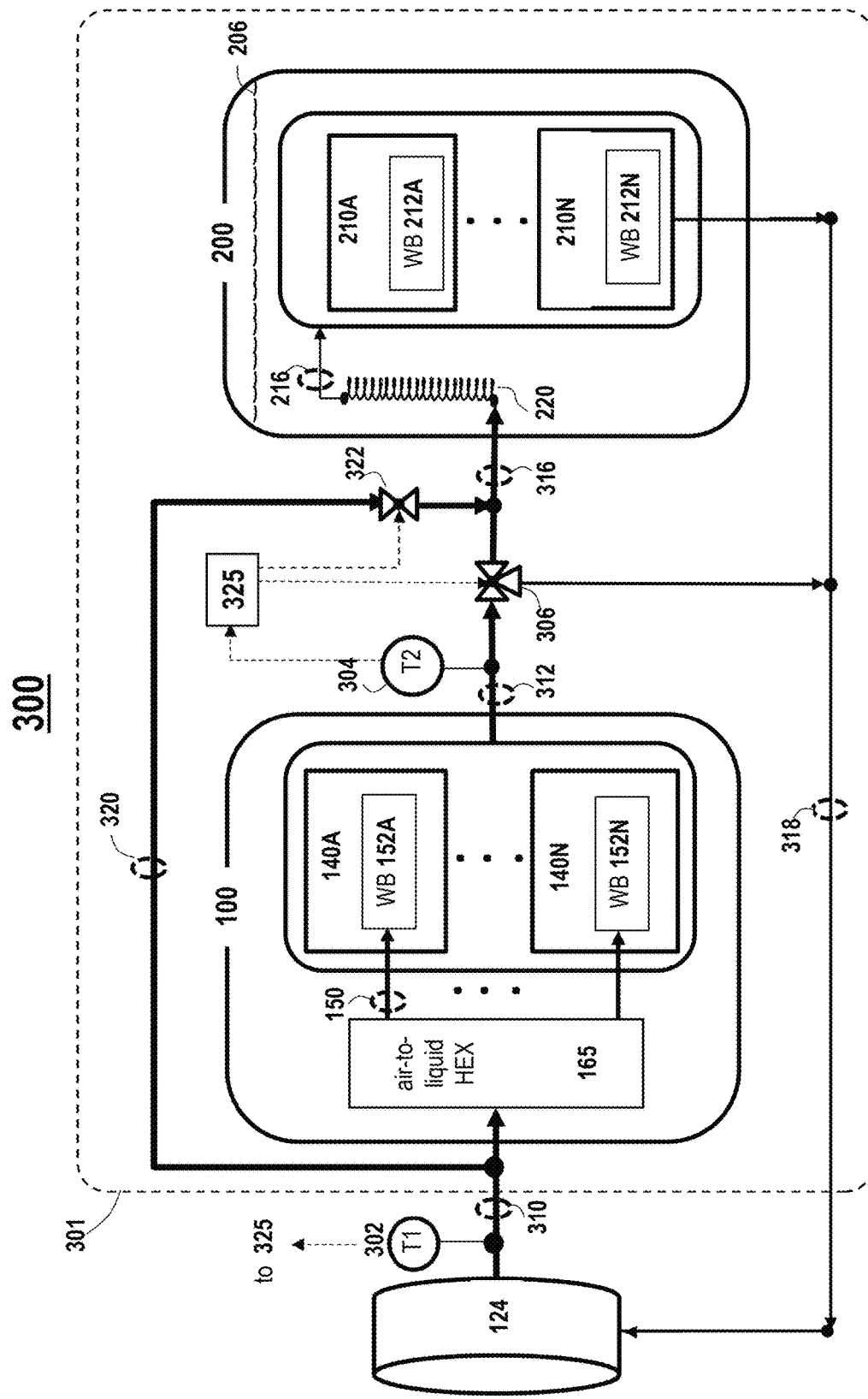
FIG. 3 illustrates a functional block diagram of a hybrid liquid cooling arrangement servicing autonomous rack and immersion cooling rack configurations within a rack assembly, in accordance with the embodiments of the present disclosure.

To this end, FIG. 3 illustrates a functional block diagram of hybrid liquid cooling arrangement 300 configured to service representative autonomous rack 100 and immersion cooling rack 200 configurations within a datacenter rack assembly 301, in accordance with the embodiments of the present disclosure.

As shown, hybrid liquid cooling arrangement 300 provides an integrative liquid cooling infrastructure between representative autonomous rack 100 and representative IC rack 200 stationed within a datacenter rack assembly 301. In particular, hybrid liquid cooling arrangement 300 exploits certain shared liquid channeling features and different temperature tolerances of the autonomous rack 100 and IC rack 200 configurations to repurpose and redirect output cooling liquid from autonomous rack 100 to assist in the cooling of less temperature sensitive IC rack 200.

With this said, in a nonlimiting embodiment, the representative autonomous rack 100 serviced by hybrid liquid cooling arrangement 300 comprises an integrated air-to-liquid heat exchanger 165 that receives cool cooling liquid from a liquid cooling source 124 through internal fluid conduits that circulates the cool cooling liquid. The cooling liquid may be a dielectric liquid or a non-dielectric liquid, for example and without limitation, water, glycol, oil or a combination thereof. Ambient air is ventilated by the fan 180 (see FIG. 1) such that the ambient air warmed by the electronic processing assemblies 140A-140N is directed in the air-to-liquid heat exchanger 165. Ambient air is thus cooled by the air-to-liquid heat exchanger 165. In other words, the cooling liquid flowing in the air-to-liquid heat exchanger 165 collects, in use, thermal energy of the ambient air. Cooled air is thus expelled from the rack frame 110 by the forced air ventilation fan 180. The cool cooling liquid thus receives thermal energy of the ambient air and may thus further be referred to as "warm cooling liquid".

In this embodiment, the liquid cooling source 124 corresponds to an output of a heat-exchanger (e.g. a dry cooler) that receives hot liquid and expels thermal energy thereof to provide the aforementioned cool cooling liquid. As such the liquid cooling source 124 is depicted as a heat-exchanger 124 in FIG. 3.

The warm cooling liquid is further forwarded to the one or more liquid cooling blocks 152A-152N in direct thermal contact with corresponding electronic processing assemblies 140A-140N, each one of the liquid cooling blocks 152A-152N including an internal fluid conduit for conducting the warm cooling liquid. The warm cooling liquid collects thermal energy of electronic processing assemblies 140A-140N upon flowing in the one or more liquid cooling blocks 152A-152N. As such, the warm cooling liquid may thus be referred to as "warmer cooling liquid" downstream the liquid cooling blocks 152A-152N.

Relatedly, in a nonlimiting embodiment, the representative IC rack 200 serviced by hybrid liquid cooling arrangement 300 comprises an immersion case 204 containing an immersion cooling fluid 206, in which one or more electronic processing assemblies 210A-210N along with corresponding liquid cooling blocks 212A-212N in direct thermal contact thereon are submerged within the dielectric immersion cooling fluid 206 along with a serpentine convection coil 220. The IC rack configuration 200 also includes a cooling liquid distribution arrangement 216 that receives the warmer cooling liquid and supplies it to the serpentine convection coil 220 and, in turn, the serpentine convection coil 220 internally channels the cooling liquid as well as forwards the channelized cooling liquid to liquid blocks 212A-212N that are in direct thermal contact with the one or more electronic processing assemblies 210A-210N, via an internal fluid distribution channel 214.

With these nonlimiting representative autonomous rack 100 and IC rack 200 configurations deployed within datacenter rack assembly 301, hybrid liquid cooling arrangement 300 implements a liquid distribution infrastructure comprising a flow controller 325, liquid flow distribution channel segments 310, 312, 316, 318, 320, temperature sensors 302, 304, and communication-enabled flow control valves 306, 322 to service the liquid cooling needs of both autonomous rack 100 and IC rack 200.

It is to be noted that the liquid flow distribution channel segments 310, 312, 316, 318, 320 may embody any suitable piping, tubing, conduit, or other sealed conveyance structures capable of effectively transferring and distributing fluids and may also consist of metal, rubber, or plastic materials, or any combination thereof. Moreover, flow control valves 306, 322 may embody any type of controllable hydraulic flow coupling component, such as, for example, electro-mechanical solenoid fluid two-way and three-way valves that are communication-enabled and configured to be operationally responsive to electronic control signals based on temperature and/or pressure information.

As shown in FIG. 3, cool cooling liquid from the heat-exchanger 124 is supplied to an input side of the of autonomous rack 100, namely, an integrated air-to-liquid heat exchanger 165, via liquid flow distribution channel segment 310. The cool cooling liquid provided by the heat-exchanger 124 is also forwarded to a two-way flow control valve 322 disposed on an output side of autonomous rack 100, via liquid flow distribution channel segment 320. The temperature of the cool cooling liquid is monitored by a temperature sensor 302.

As discussed above regarding autonomous rack 100 operations, the cool cooling liquid supplied to the heat exchanger 165 is circulated therein to provide cooled forced air ventilation, thereby collecting thermal energy of ambient air, along with being channeled to the one or more liquid cooling blocks 152A-152N in contact with corresponding electronic processing assemblies 140A-140N to provide liquid cooling therethrough. It will be appreciated, however, that as the circulating and channeled cool cooling liquid flows within the autonomous rack 100, the heat generated by the electronic processing assemblies 140A-140N is thermally transferred to the cooling liquid. This transfer of thermal energy to the channeled cooling liquid may result in the production of warmer cooling liquid.

As a result, in hybrid liquid cooling arrangement 300, the output side of autonomous rack 100, liquid flow distribution channel segment 312 forwards the warmer cooling liquid to a three-way flow control valve 306 and the temperature of the warmer cooling liquid is monitored by temperature sensor 304. Moreover, as discussed above, IC rack 200 is less temperature sensitive due to the use of dielectric immersion cooling fluids 206. Therefore, depending on certain detected cooling liquid temperature conditions, the warmer cooling liquid outputted from autonomous rack 100 may be repurposed and redirected to assist in the cooling of IC rack 200.

Correspondingly, as shown in FIG. 3, in hybrid liquid cooling arrangement 300, the autonomous rack 100 input side temperature sensor 302 monitors the temperature of the cold cooling liquid supplied by the heat exchanger 124 and communicates the detected input side temperature to the flow controller 325. Similarly, the autonomous rack 100 output side temperature sensor 304 monitors the temperature of the warmer cooling liquid outputted from autonomous rack 100 and also communicates the detected output side temperature to the flow controller 325.

The flow controller 325 is configured to receive and process the temperature data from both, the rack 100 input side temperature sensor 302 and the rack 100 output side temperature sensor 304. Moreover, based on the detected cooling liquid temperature conditions, flow controller 325 is configured to communicate operational instructions via electronic control signals to the three-way flow control valve 306 and two-way flow control valve 322.

As noted above, the communication-enabled electro-mechanical solenoid three-way flow control valve 306 and electro-mechanical solenoid two-way flow control valve 322 are configured to open (i.e., permit fluid flow) and close (i.e., restrict fluid flow) in response to communicated electronic control signals provided by the flow controller 325. As shown, in the hybrid cooling arrangement 300, the three-way flow control valve 306 controls the flow of warmer cooling liquid outputted from autonomous rack 100 directed to IC rack 200 via liquid flow distribution channel segment 312 while the two-way flow control valve 322 controls the flow of cool cooling liquid directed to IC rack 200 via liquid flow distribution channel segment 320. Therefore, based on the communicated temperature levels of temperature sensors 302, 304, the flow controller 325 functions to provide electronic control signals to the three-way flow control valve 306 and two-way flow control valve 322 in order to coordinate the source and flow of cooling liquid forwarded to IC rack 200 for cooling purposes.

By way of nonlimiting embodiments of hybrid liquid cooling arrangement 300, IC rack 200 may be effectively cooled by supplied cooling liquid having a temperature that is less than or equal to a temperature range of approximately 40-46° C. Therefore, in a first representative temperature scenario condition, if the autonomous rack 100 input side temperature sensor 302 communicates to the flow controller 325 a detected temperature in a range of approximately 20-25° C., the flow controller 325 provides electronic control signals instructing the two-way flow control valve 322 to close while instructing the three-way flow control valve 306 to open. In this manner, the open three-way flow control valve 306 forwards the flow of cooling liquid outputted from autonomous rack 100 to IC rack 200 via liquid flow distribution channel segment 316 to assist in the cooling of the corresponding one or more electronic processing assemblies 210A-210N.

In a second representative temperature scenario condition, in accordance with the nonlimiting embodiments of hybrid liquid cooling arrangement 300, if the autonomous rack 100 output side temperature sensor 304 communicates to the flow controller 325 a detected temperature in a range of approximately 40-46° C., the flow controller 325 provides electronic control signals instructing the two-way flow control valve 322 to close while instructing the three-way flow control valve 306 to open. In this manner, the open three-way flow control valve 306 forwards the flow of tolerable warmer cooling liquid outputted from autonomous rack 100 to IC rack 200 via liquid flow distribution channel segment 316 to assist in the cooling of the corresponding one or more electronic processing assemblies 210A-210N.

In a third representative temperature scenario condition, in accordance with the nonlimiting embodiments of hybrid liquid cooling arrangement 300, if the autonomous rack 100 output side temperature sensor 304 communicates to the flow controller 325 a detected temperature in a range greater than approximately 47° C., the flow controller 325 provides electronic control signals instructing the two-way flow control valve 322, which is coupled to the cool liquid source via liquid flow distribution channel segment 320, to open while instructing the three-way flow control valve 306 to close. In this manner, the open two-way flow control valve 322 forwards the flow of cool cooling liquid from the heat-exchanger 124 to the IC rack 200, via liquid flow distribution channel segment 316. The forwarded cool cooling liquid is internally channeled to the serpentine convection coil 220 of IC rack 200 to cool the ambient temperature of the dielectric fluid 206 as well as liquid blocks 212A-212N. Meanwhile, the closed three-way flow control valve 306 directs the warmer cooling liquid outputted from autonomous rack 100 back to heat-exchanger 124 for cooling treatment via a return liquid flow distribution channel segment 318.

In accordance with the nonlimiting embodiments of hybrid liquid cooling arrangement 300, the cooling liquid supplied to IC rack 200 for cooling via liquid flow distribution channel segment 316, whether it be warmer cooling liquid having tolerable temperatures that are outputted from autonomous rack 100 or cool cooling liquid forwarded by heat-exchanger 124, is received at an input side of IC rack 200 by serpentine convection coil 220. As noted above, serpentine convection coil 220 is configured to internally channel the received cooling liquid to cool the ambient temperature of dielectric immersion cooling fluid 206 as well as internally channel the received cooling liquid to the internal conduits of liquid blocks 212A-212N that are in direct thermal contact with the one or more electronic processing assemblies 210A-210N. And, after the channeled cooling liquid passes through liquid blocks 212A-212N subjected to the thermal transfer of heat generated by the corresponding electronic processing assemblies 210A-210N, the IC rack 200 is configured to direct the channeled cooling liquid from the last of the liquid blocks 212A-212N back to heat-exchanger 124 for cooling treatment via return liquid flow distribution channel segment 318.

Figure 4:
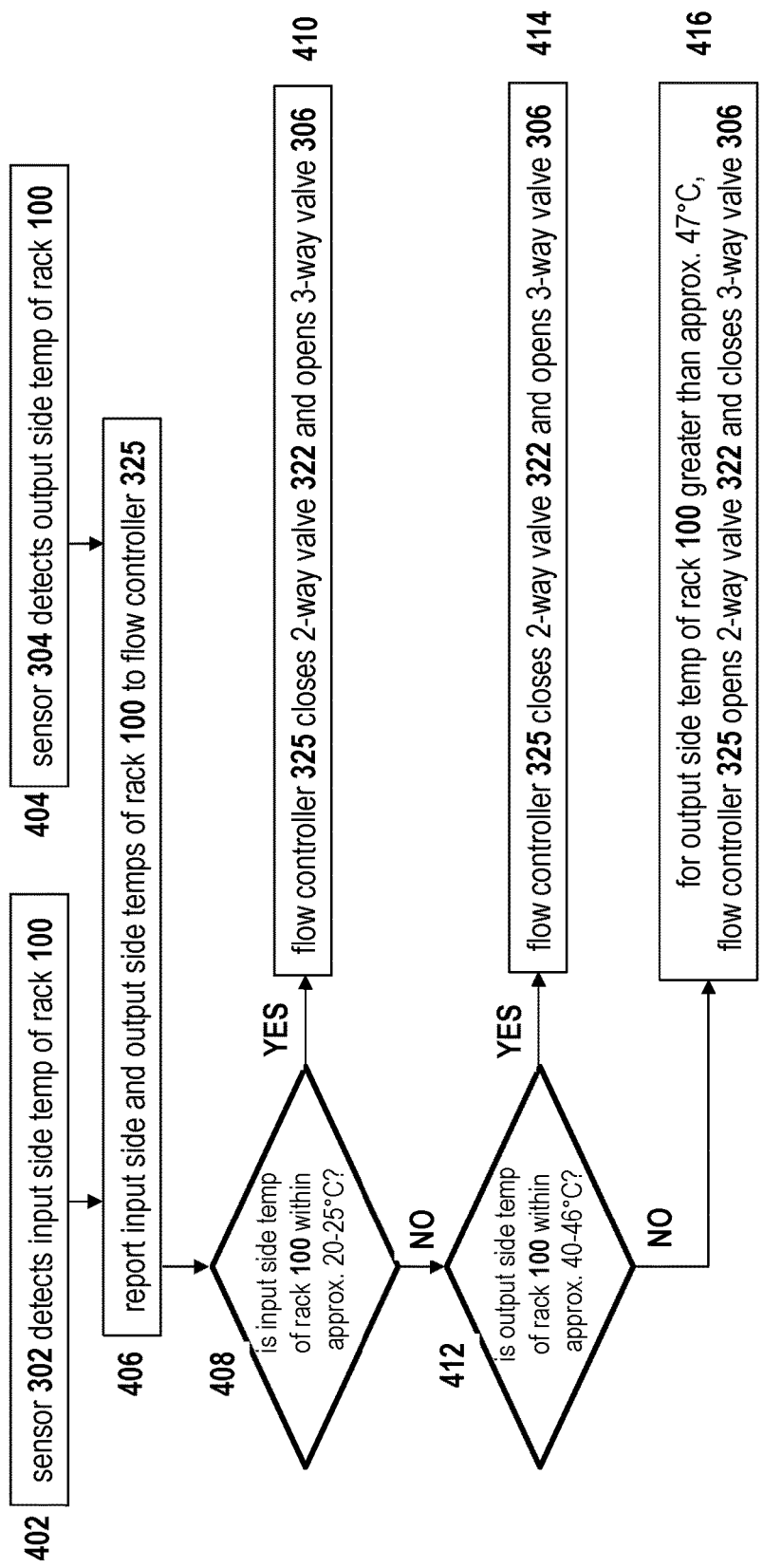
FIG. 4 illustrates a functional processing flow diagram of a hybrid liquid cooling arrangement servicing autonomous rack and immersion cooling rack configurations within a rack assembly, in accordance with the embodiments of the present disclosure.

FIG. 4 illustrates an operational process flow diagram 400 of the hybrid liquid cooling arrangement 300 servicing the autonomous rack 100 and immersion cooling rack 200 configurations coexisting within a rack assembly, in accordance with the embodiments of the present disclosure. As shown, the operational process 400 commences at process task 402 and 404 whereby temperature sensors 302 and 304 detect the input side temperature and the output side temperature of rack 100, respectively.

At process task 406, the detected the input side temperature of rack 100 as detected by temperature sensor 302 and the output side temperature of rack 100 as detected by temperature sensor 304 are communicated to the flow controller 325.

In turn, at process task 408, the flow controller 325 determines whether the communicated input side temperature of rack 100 is within approx. 20-25° C. If so, then at process task 410, the flow controller 325 provides electronic control signals instructing the two-way flow control valve 322 to close while instructing the three-way flow control valve 306 to open to enable the flow of cooling liquid outputted from the autonomous rack 100 to the IC rack 200 via liquid flow distribution channel segment 316.

If the flow controller 325 determines that the communicated input side temperature of rack 100 is beyond the approx. 20-25° C., then the operational process 400 moves to process task 412 in which the flow controller 325 determines whether the communicated outside temperature of rack 100 is within a range of approximately 40-46° C. If so, then at process task 414, the flow controller 325 provides electronic control signals instructing the two-way flow control valve 322 to close while instructing the three-way flow control valve 306 to open to enable the flow of cooling liquid outputted from the autonomous rack 100 to the IC rack 200 via liquid flow distribution channel segment 316.

If the flow controller 325 determines that the communicated input side temperature of rack 100 is beyond the approximate range of 20-25° C., then the operational process 400 moves to process task 412 in which the flow controller 325 determines whether the communicated outside temperature of rack 100 is within a range of approximately 40-46° C. If so, then at process task 414, the flow controller 325 provides electronic control signals instructing the two-way flow control valve 322 to close while instructing the three-way flow control valve 306 to open to enable the flow of cooling liquid outputted from the autonomous rack 100 to the IC rack 200 via liquid flow distribution channel segment 316.

If the flow controller 325 determines that the communicated output side temperature of rack 100 is greater the approximate range of 40-46° C., then the operational process 400 moves to process task 416 in which the flow controller 325 provides electronic control signals instructing the two-way flow control valve 322 to open while instructing the three-way flow control valve 306 to close. The open two-way flow control valve 322 forwards the flow of cool cooling liquid from the heat-exchanger 124 to the IC rack 200, via liquid flow distribution channel segment 316 to be received by the serpentine convection coil 220 to cool the ambient temperature of the dielectric fluid 206 as well as liquid blocks 212A-212N.

As presented herein, the disclosed embodiments provide a hybrid liquid cooling arrangement 300 that provides an integrative liquid cooling infrastructure that accommodates the liquid cooling needs of distinct autonomous rack 100 and IC rack 200 configurations coexisting within a datacenter rack assembly 301 by repurposing and redirecting, when tolerable temperature conditions are detected, the output cooling liquid from autonomous rack 100 to assist in the cooling of less temperature sensitive IC rack 200.

It should be noted that, although the hybrid liquid cooling arrangement 300 is illustrated and described as forming a closed cooling loop where hot cooling liquid that collected thermal energy in the autonomous rack 100 and the IC rack 200 is received by the heat exchanger 124, the heat exchanger 124 providing cooling of said hot cooling liquid such that cold cooling liquid is recirculated back to the autonomous rack 100 and the IC rack 200, the hybrid liquid cooling arrangement 300 may be an open loop in alternative embodiments. More specifically, the hybrid liquid cooling arrangement 300 may receive cold cooling liquid from a cool liquid source and discharge hot cooling liquid to a same or distinct entity in any suitable manner.

In view of the various disclosures directed to a hybrid liquid cooling arrangement implementing an integrative liquid cooling infrastructure for servicing both autonomous racks and IC racks deployed within a datacenter rack assembly, it will be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A datacenter rack assembly housing racks with different cooling configurations, comprising:
    a first rack comprising:
        an air-to-liquid heat exchanger configured to provide air-ventilated cooling liquid from a liquid source to the first rack,
        at least one electronic processing assembly,
        a first internal fluid conduit configured to receive the cooling liquid from the air-to-liquid heat exchanger and circulate the cooling liquid throughout a first at least one liquid cooling block, the first of the at least one liquid cooling block having a first internal fluid distribution channel that is in thermal contact with the first at least one electronic processing assembly;
    a second rack, comprising:
        a dielectric immersion cooling fluid,
        a serpentine convection coil immersed in the dielectric immersion cooling fluid that is structured with multiple hollow coils to receive the cooling liquid exiting the first at least one liquid cooling block and forward the cooling liquid,
        a second at least one electronic processing assembly immersed in the dielectric immersion cooling fluid,
        a second internal fluid conduit configured to receive the cooling liquid exiting the serpentine convection coil and to circulate the cooling liquid throughout a second at least one liquid cooling block having a second internal fluid distribution channel that is arranged to be in thermal contact with the second at least one electronic processing assembly,
    a central flow controller configured to operatively control the circulation of the cooling liquid flowing through the first rack and the second rack; and
    a liquid cooling distribution arrangement, fluidly coupled to the first internal fluid conduit of the first rack and fluidly coupled to the second internal fluid conduit of the second rack, the liquid cooling distribution arrangement configured to circulate the cooling liquid throughout the first rack and the second rack, according to the operative control of the central flow controller.

2. The datacenter rack assembly of claim 1, wherein the liquid cooling distribution arrangement further comprises:
    a first liquid flow distribution channel segment configured to forward the cooling liquid from the liquid cooling source to the first rack; and
    a second liquid flow distribution channel segment configured to forward the cooling liquid from the first rack to the second rack.

3. The datacenter rack assembly of claim 2, wherein the second liquid flow distribution channel segment is communicatively coupled to a communication-enabled three-way flow control valve controlled by the central flow controller and a third liquid flow distribution channel segment configured to forward cooling liquid to the second rack.

4. The datacenter rack assembly of claim 3, further comprising:
    a fourth liquid flow distribution channel segment configured to forward cooling liquid from the liquid cooling source to a communication-enabled two-way flow control valve controlled by the central flow controller; and
    a fifth liquid flow distribution channel segment configured to return cooling liquid from the first rack and the second rack back to the liquid cooling source.

5. The datacenter rack assembly of claim 4, further comprising:
    a first temperature sensor, communicatively coupled to the first liquid flow distribution channel segment and the central flow controller, and configured to detect a temperature of the liquid cooling source; and
    a second temperature sensor, communicatively coupled to the second liquid flow distribution channel segment and the central flow controller, and configured to detect a temperature of the forwarded cooling liquid from the first rack,
    wherein the central flow controller operates to:
    when the first temperature sensor detects a temperature of the liquid cooling source to be less than or equal to a first temperature range, control the two-way flow control valve to close and the three-way flow control valve to open and enable the cooling liquid from the first rack to flow to the second rack via the third liquid flow distribution channel segment.

6. The datacenter rack assembly of claim 5, wherein the central flow controller further operates to:

when the second temperature sensor detects a temperature of the cooling liquid outputted from the first rack to be less than or equal to a second temperature range, control the two-way flow control valve to close and the three-way flow control valve to open and enable the cooling liquid to flow from the first rack to the second rack via the third liquid flow distribution channel segment, and when the second temperature sensor detects a temperature of the cooling liquid outputted from the first rack to be in a third range that is greater than the second temperature range, control the three-way flow control valve to close and the two-way flow control valve to open and enable the cooling liquid to flow from the liquid cooling source provided by the fourth liquid flow distribution channel segment to the second via the third liquid flow distribution channel segment.

7. The datacenter rack assembly of claim 4, wherein the first, second, third, fourth, and fifth liquid flow distribution channel segments comprise piping, tubing, conduits and/or any suitable sealed fluid conveyance structures formed from metal, rubber, and/or plastic materials.

8. The datacenter rack assembly of claim 4, wherein the three-way flow control valve and the two-way flow control valve comprise a communication-enabled electro-mechanical solenoid control fluid valves that are configured to be operationally responsive to temperature bearing electronic control signals.

9. The datacenter rack assembly of claim 5, wherein, when the second temperature sensor detects a temperature of the cooling liquid outputted from the first rack to be in the third range, the three-way flow control valve operates to return the cooling liquid from the first rack back to the liquid cooling source via the fifth liquid flow distribution channel segment.

10. The datacenter rack assembly of claim 5, wherein the first temperature range detected by the first temperature sensor comprises approximately 20-25° C.

11. The datacenter rack assembly of claim 6, wherein the second temperature range detected by the second temperature sensor comprises approximately 40-46° C.

12. The datacenter rack assembly of claim 6, wherein the third temperature range detected by the second temperature sensor comprises approximately 47° C. or greater.

* * * * *